United States Patent [19]
Ryat

[11] Patent Number: 5,294,893
[45] Date of Patent: Mar. 15, 1994

[54] DIFFERENTIAL OUTPUT AMPLIFIER INPUT STAGE WITH RAIL-TO-RAIL COMMON MODE INPUT RANGE

[75] Inventor: Marc H. Ryat, Santa Clara, Calif.

[73] Assignee: SGS-Thomson Microelectronics, Inc., Carrollton, Tex.

[21] Appl. No.: 968,886

[22] Filed: Oct. 30, 1992

[51] Int. Cl.$^5$ .............................................. H03F 3/45
[52] U.S. Cl. .................................. 330/258; 330/257; 330/311
[58] Field of Search ........................ 330/257, 258, 311

[56] References Cited

U.S. PATENT DOCUMENTS 5,006,817  4/1991  Babanezhad ................... 330/258 X

OTHER PUBLICATIONS

R. J. Wildar, "Low-voltage techniques", IEEE Jour. Solid State Cir., vol. SC-13, pp. 836-846, Dec. 1978.
Huijsing et al., "Low-voltage operational amplifier with rail-to-rail input and output ranges", IEEE J. Solid State Cir., vol. SC-20, No. 6, pp. 1144-1150, Dec. 1985.
Fonderie et al., IEEE J. Solid State Cir., vol. SC-24, No. 6, pp. 1551-1559, Dec. 1989.
Callewaert et al., "Class AB CMOS amplifiers with high efficiency", IEEE J. Solid State Cir., vol. 25, No. 3, pp. 684-692, Jun. 1990.
Brehmer et al., "Large-swing CMOS power amplifier", IEEE J. Solid State Cir., vol. SC-18, pp. 624-629, Dec. 1983.
Fisher, "A high-performance CMOS power amplifier", IEEE J. Solid State Cir., vol. SC-20, No. 6, pp. 1200-1205, Dec. 1985.
Monticelli, "A quad CMOS single-supply op amp with rail-to-rail output swing", IEEE J. Solid State Cir., vol. SC-21, No. 6, pp. 1026-1034, Dec. 1986.
Fisher, "A highly linear CMOS buffer amplifier", IEEE J. Solid State Cir., vol. SC-22, No. 3, pp. 330-334, Jun. 1987.
Steyaier et al., "A high-dynamic-range CMOS op amp with low-distortion output structure", IEEE J. Solid State Cir., vol. SC-22, No. 6, pp. 1204-1207 Dec. 1987.
Babenezhad, "A rail-to-rail CMOS op amp", IEEE J. Solid State Cir., vol. SC-23 No. 6, pp. 1414-1417, Dec. 1988.
Pardoen et al. "A rail-to-rail input/output CMOS power amplifier", IEEE J. Solid State Cir., vol. SC-25, No. 2, pp. 501-504, Apr. 1990.
Babanezhad et al., "A programmable gain/loss circuit", IEEE J. Solid State Cir., vol. SC-22, No. 6, pp. 1082-1090, Dec. 1987.
Nagaraj, "Large-swing CMOS buffer amplifier", IEEE J. Solid State Cir., vol. SC-24, pp. 181-183, Feb. 1989.

(List continued on next page.)

Primary Examiner—James B. Mullins
Attorney, Agent, or Firm—Richard A. Bachand; Lisa K. Jorgenson; Richard K. Robinson

[57] ABSTRACT

An amplifier having a rail-to-rail common mode input range that can be used in low voltage power supply applications includes differential input and output stages, the output stage having first and second current paths. First and second output duplicating circuits are respectively connected in parallel with the first and second current paths in the differential output stage to duplicate the differential output. A circuit for detecting a common-mode voltage difference is provided between nodes of the first and second output duplicating circuits for developing a current related to the common-mode voltage difference. A current mirror circuit is connected to receive the current related to the common-mode voltage difference for controlling the current in the first and second current paths in the differential output stage. The circuit for detecting a common-mode voltage difference between nodes of the first and second output duplicating circuits can be established by a transistor that senses only common-mode current. The transistor has a control element connected to the nodes in the output duplicating circuits and a current path to a supply voltage.

20 Claims, 1 Drawing Sheet

OTHER PUBLICATIONS

Mistlberger et al., "Class-AB high-swing CMOS power amplifier", IEEE J. Solid State Cir., vol. SC-27, No. 7, pp. 1089–1092, Jul. 1992.

Malhi et al., "A low-voltage micropower JFET/bipolar operational amplifier", IEEE J. Solid State Cir., vol. SC-16, No. 6, pp. 669–676, Dec. 1981.

Davis et al., "Design techniques for improving the HF response of a monolithic JFET operational amplifier", IEEE J. S. State Cir., vol., SC-19, No. 6, pp. 978–985, Dec. 1984.

Vyne et al., "A monolithic P-channel JFET quad op amp with in-package trim and enhanced gain-bandwidth product", IEEE J. S. State Cir., vol. SC-22, No. 6, pp. 1130–1138, Dec. 1987.

Seevinck et. al., "A low-distortion output stage with improved stability for monolithic power amplifiers", IEEE J. Solid State Cir., vol. SC-23, No. 3 pp. 794–801, Jun. 1988.

Widlar et al., "A monolithic power op amp", IEEE J. S. State Cir., vol. SC-23, No. 2, pp. 527–535, Apr. 1988.

Quiting, "A CMOS power amplifier with a novel output structure", IEEE J. Solid State Cir., vol. SC-27, No. 2, pp. 203–207, Feb. 1992.

Fondirie et al., "Operational amplifier with 1-V rail-to-rail multipath-driven Output Stage", IEEE J. Solid State Cir., vol. 26, No. 12, Dec. 1991.

Gilbert, "A new wide-band amplifier technique", IEEE J. Solid State Cir., vol. SC-3, No. 4, Dec. 1968.

Castello et al., "A high-performance micropower switched-capacitor Filter", IEEE J. Solid State Cir., vol. SC-20, No. 6, Dec. 1985.

Fiez et al., "A family of high-swing CMOS operational amplifiers", IEEE J. Solid State Cir., vol. 24, No. 6, pp. 1683–1687, Dec. 1989.

Op't Eynde et al., "A CMOS large-swing low-distortion three-stage class AB power amplifier", IEEE J. Solid State Cir., pp. 265–273, vol. 25, No. 1, Feb. 1990.

Lee et al., "A high slew-rate CMOS amplifier for analog signal processing", IEEE J. Solid State Cir., vol. 25, No. 3, pp. 885–889, Jun. 1990.

Banu, et al., "Fully differential Operational Amplifiers with Accurate Output Balancing", *IEEE Journal of Solid-State Circuits*, vol. SC-23, No. 6, pp. 1410–1414 Dec. 1988.

P. W. Li et al., "A Ratio-Independent Algorithmic Analog-to-Digital Conversion Technique", *IEEE Journal of Solid State Circuits*, vol. SC-19, No. 6, pp. 828–836, Dec. 1984.

De la Plaza, et al., "Power-Supply Rejection in Differential Switched-Capacitor Filters", *IEEE Journal of Solid-State Circuits*, vol. SC-19, No. 6, pp. 912–918, Dec. 1984.

M. Degrauwe, et al., "A micropower CMOS-Instrumentation Amplifier", *IEEE Journal of Solid-State Circuits*, vol. SC-20, No. 3, pp. 805–807, Jun. 1985.

DIFFERENTIAL OUTPUT AMPLIFIER INPUT STAGE WITH RAIL-TO-RAIL COMMON MODE INPUT RANGE

BACKGROUND OF THE INVENTION

1. FIELD OF THE INVENTION

This invention relates to improvements in amplifier circuits, and, more particularly, to improvements in differential amplifiers that result in high power supply rejection ratios.

2. BACKGROUND INFORMATION

It is often desired to be able to use an amplifier having a differential output in applications in which a high power supply rejection ratio (PSRR) is needed, particularly in operational amplifiers and the like. However, unless extremely precise layout precautions and matching of component parts is employed, achieving a high power supply rejection ratio is difficult. This is particularly true in circuits that use low voltage power supplies, an increasing trend in portable device technology.

In the past, various solutions have been advanced toward solving this problem. One way that has been used is to provide multiple cascode stages. However, particularly in the low supply voltage applications mentioned, cascoding of stages is impractical.

The problem is further exacerbated by limitations on the operating range of the circuitry. Increasingly popular circuits are so-called "rail-to-rail" circuits that provide dc operating ranges to voltages as close as possible to the voltages of the power supplies.

In such circuits, fully differential operation necessitates sensing of the common mode input voltage through current mirrors used in combination with various current sources. Aside from the problems of balancing the current values provided from the various current sources, mirror circuits then receive cascoding of their inputs and outputs, and are difficult to use in circuit embodiments in which differential outputs are to be provided under low-supply constraints.

SUMMARY OF THE INVENTION

In light of the above, it is, therefore, an object of the invention to provide an improved amplifier stage with a differential output, and rail-to-rail common mode input range.

It is another object of the invention to provide an improved amplifier of the type described that forms a high-swing gain with two separate out of phase outputs from a differential signal that can be used in rail-to-rail class AB operational amplifiers or fully differential operational amplifiers.

It is another object of the invention to provide an improved amplifier of the type described that does not require common mode voltage sensing.

It is yet another object of the invention to provide an improved amplifier of the type described that does not require cascoding of the input pairs.

It is still another object of the invention to provide an improved amplifier of the type described that is more compact and lends itself to low-supply voltage designs.

These and other objects, features and advantages of the invention will be apparent to those skilled in the art from the following detailed description of the invention, when read in conjunction with the accompanying drawings and appended claims.

In accordance with a broad aspect of the invention, an amplifier is presented that has a rail-to-rail common mode input range, and can be used in low voltage power supply applications. The amplifier includes differential input and output stages, the output stage having first and second current paths. First and second output duplicating circuits are respectively connected in parallel with the first and second current paths in the differential output stage to duplicate the differential output. A circuit for detecting a common-mode voltage difference is provided between nodes of the first and second output duplicating circuits for developing a current related to this voltage difference. A current mirror circuit is connected to receive the current related to the common-mode voltage variation for controlling the current in the first and second current paths in the differential output stage.

The amplifier can be implemented with bipolar or transistors, by which the differential input stage can be constructed to provide two pairs of complementary transistors. Each pair of complementary transistors receives a respective differential input. First and second input stage current sources to bias transistors of respective first and second conductivity types. Likewise, the differential output stage may be constructed with first and second pairs of complementary transistors, the transistors of each pair respectively providing the first and second current paths. First and second output stage current sources are connected to provide current respectively to the first and second current paths. A low supply voltage embodiment may have resistors provided in place of the output stage current sources.

The circuit for detecting a common-mode voltage difference between nodes of the first and second output duplicating circuits can be established by a transistor having a control element connected to the nodes in the output duplicating circuits and a current path to a supply voltage. The current mirror is further connected to the current path of the transistor, having first and second dc control current paths in series with the first and second current paths of the output duplicating circuits. The transistor senses only common mode current.

BRIEF DESCRIPTION OF THE DRAWING

The invention is illustrated accompanying drawing, in which.

In the circuit embodiments, like reference numerals are used to denote like or similar parts.

DETAILED DESCRIPTION OF THE PREFERRED EMBODIMENTS

Figure 1:
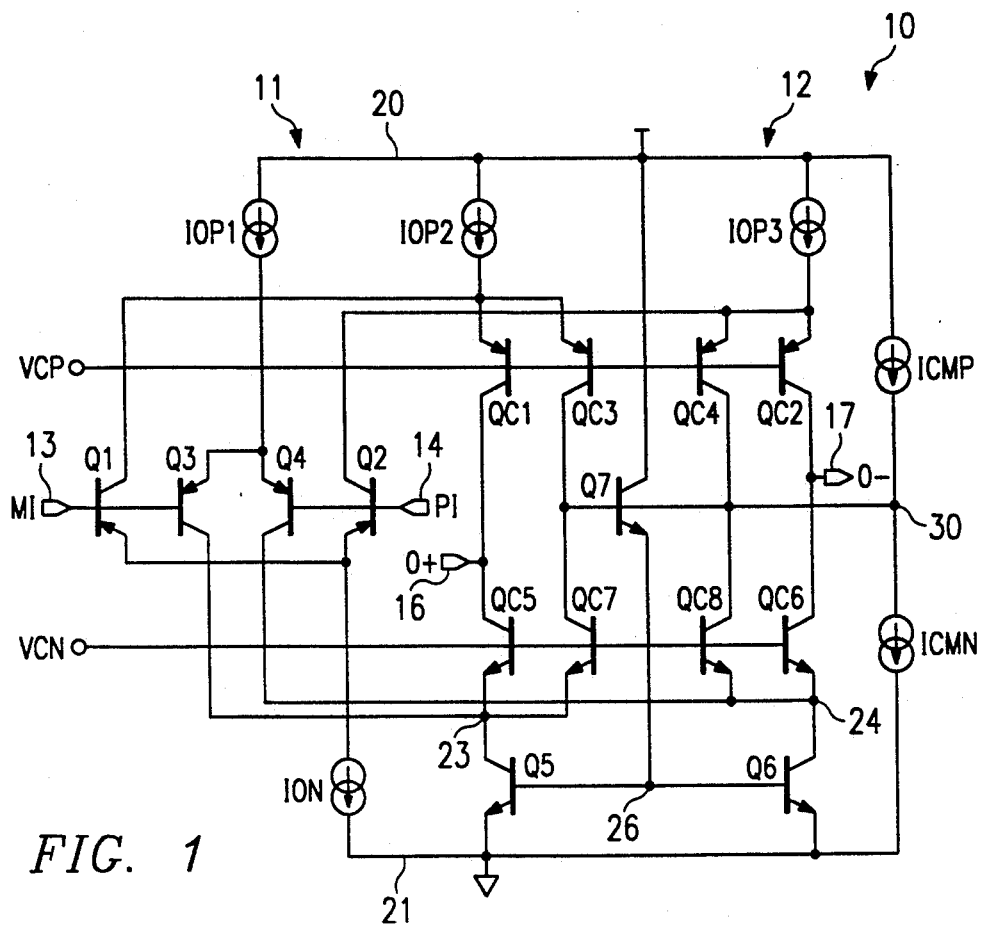
FIG. 1 is an electrical schematic diagram of a differential amplifier circuit having a rail-to-rail input stage, a differential output and a high power supply rejection ratio.

As shown in FIG. 1, transistors Q1-Q4 are connected to form a classical PNP-NPN input combination for a rail-to-rail input stage.

In prior art designs, it is necessary to sense when one of the pairs of PNP-NPN transistors turns off to activate a current source that will compensate the unbalance between top and bottom currents. This necessitates the use of additional dummy input transistors connected in parallel with transistors Q1-Q4, and also necessitates the use of mirrors that control the currents I0P2 and I0P3. Cascoding of all of the currents is also needed to avoid common mode rejection ratio degradation due to poor current matching, or systematic offset. This has a drawback in that the input capacitance and current of the dummy components is increased. In addition, the input swing and minimum supply voltage are reduced due to cascoding. The circuit is of higher complexity, and, therefore, is of larger circuit size.

Briefly, in accordance with the embodiment of the invention shown in FIG. 1, the common mode current is extracted by transistors QC3 and QC4. This current is injected into QC7 and QC8. QC7 and QC8 act as the input transistors of a current mirror formed of transistors Q5 and Q6. Any variation of the common mode current caused by either I0N or I0P turning off is therefore fed back via QC5 and QC6 to both branches of the input stage. Thus, all dc currents remain balanced and equal (i.e., IC1=IC5, and IC2 =IC6).

Variations of I0N are absorbed by transistors QC3 and QC4, while transistors QC7 and QC8 play the same role for I0P1.

Transistor Q7 serves as a dc level shift between the bases of transistors Q5 and Q6 and the collectors of the four common mode current carrying devices QC3, QC4, QC7, and QC8. The bases of transistors Q5 and Q6 are connected to the emitter of transistor Q7 at node 26.

Common mode feedback is represented by the ICMP and ICMN current sources. The ICMP and ICMN current sources regulate the dc voltages at nodes 0+ and 0— in particular implementations where common mode feedback is needed. An increase of the current difference (ICMP - ICMN) causes both 0+ and 0— to fall.

The overall gain of the stage is equivalent to the gain of a non-cascoded stage divided by a factor of 2, due to the splitting of input signals at the emitters of the cascode transistor pairs. Thus, for example, any current variation coming from transistor Q1 shares into DI/2 flowing through QC1 as a differential signal current, and DI/2 flowing through transistor QC3 as one-half of the total common mode current that arrives at the bottom mirrors input at transistors QC7 and QC8.

More particularly, the amplifier 10 in accordance with the invention includes a differential input stage 11 to receive a differential signal on input terminals 13 and 14, and a differential output stage 12 to produce an output signal on output terminals 16 and 17. The input stage 11 includes two pairs of complementary transistors. The first pair of complementary transistors Q1 and Q3 receives differential signals on terminal 13 on their respective bases. Likewise, the complementary transistor pair including transistors Q2 and Q4 receives input on input terminal 14 on their respective bases. It should be noted that the embodiment 10 shown in FIG. 1 is configured with bipolar transistors; however, those skilled in the art will appreciate that FET and other transistor types can be equally advantageously employed with appropriate circuit modifications.

The emitters of the PNP transistors Q3 and Q4 are connected through a current source I0PI to a line 20 connected to a power supply voltage. Likewise, the emitters of the NPN transistors Q1 and Q2 are connected by a current source I0N to a line 21 connected to ground, or a reference potential. The output from the input stage 11 is derived on the collectors of the transistors Q1-Q4 that are connected to the output stage 12, as next described.

The output stage 12 includes two pairs of complementary transistors. The first pair includes a PNP transistor QC1 and an NPN transistor QC5 having a current path in series therethrough. The emitter of the transistor QC1 is connected by a current source I0P2 to the line 20 on which the power supply voltage appears. On the other hand, the emitter of the NPN transistor QC5 is connected to a node 23 that is connected to a current mirror circuit described below in detail. The output of the transistors QC1 and QC5 is provided by the first current path established therethrough and is delivered on output terminal 16 on their respective collectors.

The second complementary pair of transistors in the output stage 12 is provided by PNP transistor QC2 and NPN transistor QC6. The transistors QC2 and QC6 are connected to provide a second current path that includes a current source I0P3 connected to the power supply line 20. The emitter of the lower transistor QC6 is connected to a node 24 that is connected to the current mirror circuit described below. The output of the complementary transistors QC2 and QC6 is delivered on terminal 17 from the collectors of the two transistors.

In accordance with the invention, two additional pairs of complementary transistors are provided, each pair connected in parallel with the complementary transistors of the output circuit 12. Thus, more particularly, PNP transistor QC3 and NPN transistor QC7 are connected between the node 23 and the emitter of the PNP transistor QC1. The current flowing through the current flow path established by transistors QC3 and QC7, therefore, duplicates the output current flowing through the complementary transistor pair including transistors QC1 and QC5.

In a similar manner, PNP transistor QC4 and NPN transistor QC8 are connected between the node 24 and the emitter of the output transistor QC2. The current, therefore, flowing in the current flow path provided by the transistors QC4 and QC8 duplicates the current flowing in the output current flow path established by the transistors QC2 and QC6. The collectors of the NPN transistors Q1 and Q2 of the input stage 11 are connected respectively to the emitters of the PNP transistors QC1 and QC3 and to the emitters of the PNP transistors QC2 and QC4. Similarly, the collectors of PNP transistors Q3 and Q4 of the input stage 11 are connected to the emitters of the NPN transistors QC5 and QC7 and to the emitters of NPN transistors QC6 and QC8 on respective nodes 23 and 24.

A biasing voltage VCP is applied to the bases of the output transistors QC1, QC2, QC3, and QC4. A similar bias voltage VCN is applied to the bases of the output transistors QC5, QC6, QC7, and QC8.

The duplicating transistor circuit comprising transistors QC3, QC4, QC7, and QC8 provides the input to a current mirror that includes an NPN transistor Q7 connected between the power supply line 20 and a line connecting the bases of NPN transistors Q5 and Q6. Transistor Q5 is connected between node 23 and ground line 21. Similarly, transistor Q6 is connected between node 24 and the ground line 21. The base of the transistor Q7 is connected to the collectors of transistors QC3, QC4, QC7, and QC8 of the duplicating circuit, as well as to a node 30.

With respect to the node 30, a current source ICMP is optionally provided between the node 30 and the power supply line 20, and, a current source ICMN is optionally provided between node 30 and the ground line 21. The current sources ICMP and ICMN are required to implement dc common-mode feedback in order to have the otuputs swing around a given reference voltage, as customary in all fully differential operational amplifiers.

In operation, the transistors of the duplicating circuit including transistors QC3, QC4, QC7, and QC8 duplicate the common mode current that flows in the current flow paths of the output transistors QC1, QC5, QC2, and QC6. The transistors QC3 and QC4, as mentioned, form the input to a mirror circuit, that is fed only by the common mode current. The output of the mirror circuit is provided by transistors Q5 and Q6 that are connected in a cascode manner to nodes 23 and 24. Thus, any change in the common mode current is reflected by the output of the current mirror circuit in transistors Q5 and Q6 to affect the current in the current flow paths of the respective complementary transistor pairs QC1 and QC5 and of transistors QC2 and QC6. It will, therefore, be appreciated that the power supply rejection ratio is dramatically improved since the systematic input offset voltage is corrected for virtually any change in the power supply voltage. This enables the circuit embodiment 10 to be fabricated with integrated circuit techniques, where supply rejection becomes due to the fully differential structure solely limited by component mismatch effects, which can be minimized by careful layout.

Figure 2:
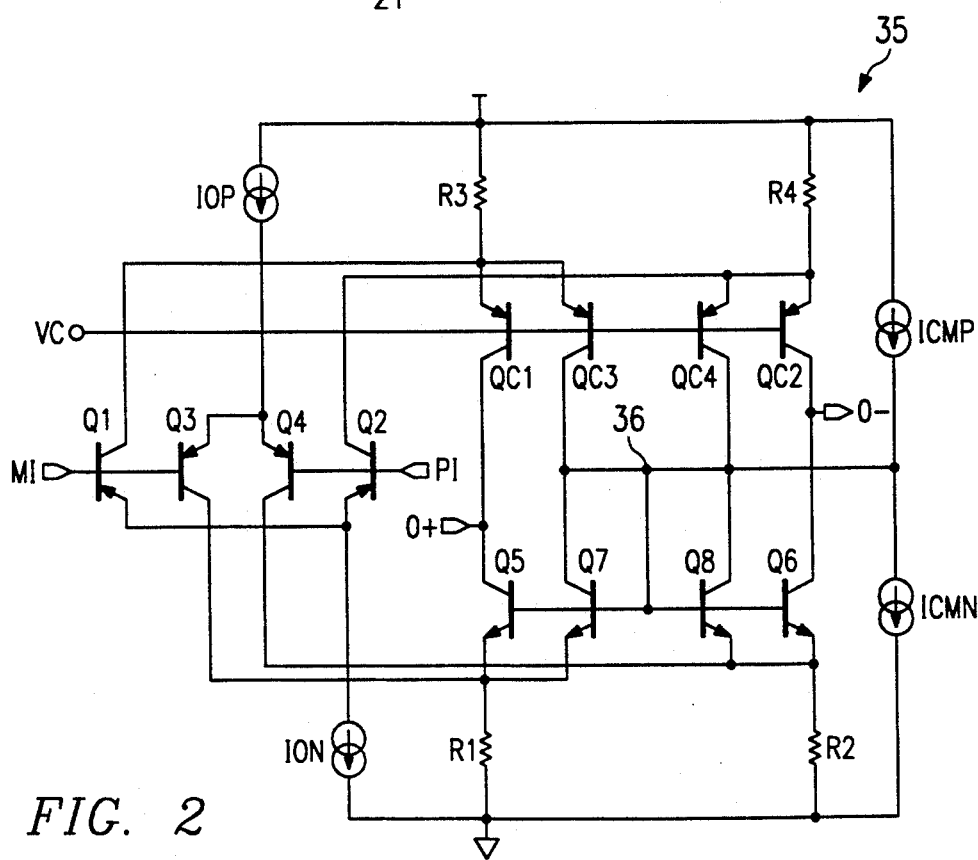
FIG. 2 is an electrical schematic diagram of a circuit constructed in accordance with the principles described with respect to FIG. 1, in which resistors are substituted for current supplies and a cascode current mirror.

A schematic diagram of a similar embodiment 35 is shown in FIG. 2. The circuit 35 is constructed similarly to the circuit 10 described above with reference to FIG. 1, except that resistors R1 and R2 are substituted for transistors Q5 and Q6 of the mirror output circuit. In addition, resistors R3 and R4 are substituted for current sources I0P2 and I0P3. The collectors of the output current duplicating circuit transistors QC3, QC4, Q7 and Q8 are interconnected by a line 36 that also is connected to the bases of the NPN transistors Q5, Q6, Q7, and Q8. The primary advantage of the circuit embodiment 35 of FIG. 2 is its ability to operate with lower voltage power supplies. Thus, with respect to the FIG. 2 embodiment, low voltage performance is realized using emitter resistors instead of current sources and mirrors.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

Claim:

1. An amplifier having a rail-to-rail common mode input range, comprising:
    a differential input stage;
    a differential output stage having first and second current paths;
    first and second output duplicating circuits respectively connected in parallel with said first and second current paths in said differential output stage to duplicate the differential output of said differential output stage;
    a circuit for detecting a common-mode voltage difference between nodes of said first and second output duplicating circuits for developing a current related to said common-mode voltage difference; and
    a current mirror circuit connected to receive said current related to said common-mode voltage difference for controlling the current in said first and second current paths in said differential output stage.

2. The amplifier of claim 1 wherein said amplifier is implemented with bipolar transistors.

3. The amplifier of claim 1 wherein said differential input stage comprises two pairs of complementary bipolar transistors, each pair receiving a respective differential input, and first and second input stage current sources to bias transistors of respective first and second conductivity types.

4. The amplifier of claim 1 wherein said differential output stage comprises first and second pairs of complementary transistors, the transistors of each pair respectively providing said first and second current paths, and further comprising first and second output stage current sources connected to provide current respectively to said first and second current paths.

5. The amplifier of claim 1 wherein said differential output stage comprises first and second pairs of complementary transistors, the transistors of each pair respectively providing said first and second current paths, and further comprising first and second resistors connected to provide current respectively to said first and second current paths.

6. The amplifier of claim 1 wherein said a circuit for detecting a common-mode voltage difference between nodes of said first and second output duplicating circuits is a transistor having a control element connected to said nodes in said output duplicating circuits and a current path to a supply voltage, and further comprising a current mirror connected to said current path of said transistor, having first and second dc control current paths in series with said first and second current paths of said output duplicating circuits.

7. The amplifier of claim 6 wherein said transistor having a control element connected to said nodes senses only common mode current.

8. The amplifier of claim 1 wherein said circuit for detecting a common-mode voltage difference between nodes of said first and second output duplicating circuits is a connection between said nodes in said output duplicating circuits to current control elements in said first and second current paths of said differential output stage.

9. The amplifier of claim 1 further comprising a pair of current sources connected between said nodes of said first and second output duplicating circuits and respective power supply voltages.

10. An amplifier having a rail-to-rail common mode input range, comprising:
    a differential input stage;
    a differential output stage having first and second current paths;
    first and second current mirror input circuits respectively connected in parallel with said first and second current paths in said differential output stage to duplicate the differential output of said differential output stage;
    a circuit for detecting a common-mode voltage difference between nodes of said first and second current mirror input circuits for developing a current related to said common-mode voltage difference; and
    a current mirror output circuit connected to receive said current related to said common-mode voltage difference for controlling the current in said first and second current paths in said differential output stage.

11. The amplifier of claim 10 wherein said amplifier is implemented with bipolar transistors.

12. The amplifier of claim 10 wherein said differential input stage comprises two pairs of complementary bipolar transistors, each pair receiving a respective differential input, and first and second input stage current sources to bias transistors of respective first and second conductivity types.

13. The amplifier of claim 10 wherein said differential output stage comprises first and second pairs of complementary transistors, the transistors of each pair respectively providing said first and second current paths, and further comprising first and second output stage current sources connected to provide current respectively to said first and second current paths.

14. The amplifier of claim 10 wherein said a circuit for detecting a common-mode voltage difference between nodes of said first and second current mirror input circuits is a transistor having a control element connected to said nodes in said first and second current mirror input circuits and a current path to a supply voltage, and further comprising a current mirror connected to said current path of said transistor, having first and second common-mode control current paths in series with said first and second current mirror input circuits.

15. The amplifier of claim 14 wherein said transistor having a control element connected to said nodes senses only common mode current.

16. The amplifier of claim 10 further comprising a pair of current sources connected between said nodes of said first and second current mirror input circuits and respective power supply voltages.

17. A bipolar differential amplifier having a rail-to-rail common mode input range, comprising:
a differential input stage including first and second pairs of complementary bipolar transistors, each pair receiving a respective differential input, and first and second input stage current sources to bias transistors of respective first and second conductivity types;

a differential output stage including third and fourth pairs of complementary transistors, the transistors of each pair respectively providing said first and second output current paths;

first and second output stage current sources connected to provide current respectively to said first and second output current paths;

fifth and sixth pairs of complementary transistors, respectively connected in parallel with said third and fourth pairs of complementary transistors in said differential output stage to duplicate the current of said first and second output current paths;

a circuit for detecting a common-mode voltage difference between nodes between transistors of said fifth and sixth pairs of complementary transistors; and a current mirror circuit connected to receive said detected common-mode voltage difference for controlling the common mode currents in said first and second current paths in said differential output stage.

18. The amplifier of claim 17 wherein said a circuit for detecting a common-mode voltage difference between nodes of said fifth and sixth pairs of complementary transistors is a transistor having a control element connected to said nodes and a current path to a supply voltage, said transistor being connected to said current mirror.

19. The amplifier of claim 18 wherein said transistor senses only common-mode current.

20. The amplifier of claim 17 wherein said a circuit for detecting a common-mode voltage difference between nodes of said transistors of said fifth and sixth pairs of complementary transistors is a connection between said nodes to control said third and fourth pairs of complementary transistors.

* * * * *